United States Patent
Rogers (10) Patent No.: US 9,985,588 B2
(45) Date of Patent: May 29, 2018

(54) DISTORTION CORRECTION IN CASCODE POWER AMPLIFIERS

(71) Applicant: SKYWORKS SOLUTIONS, INC., Woburn, MA (US)

(72) Inventor: John William Mitchell Rogers, Nepean (CA)

(73) Assignee: Skyworks Solutions, Inc., Woburn, MA (US)

(*) Notice: Subject to any disclaimer, the term of this patent is extended or adjusted under 35 U.S.C. 154(b) by 0 days. days.

(21) Appl. No.: 15/343,042

(22) Filed: Nov. 3, 2016

(65) Prior Publication Data
US 2017/0133988 A1     May 11, 2017

Related U.S. Application Data

(60) Provisional application No. 62/253,667, filed on Nov. 10, 2015.

(51) Int. Cl.
| | |
|---|---|
| H03F 1/32 | (2006.01) |
| H04B 1/40 | (2015.01) |
| H03F 3/19 | (2006.01) |
| H03F 3/21 | (2006.01) |
| H03F 1/02 | (2006.01) |
| H03F 1/56 | (2006.01) |

(52) U.S. Cl.
CPC .......... *H03F 1/32* (2013.01); *H03F 1/0205* (2013.01); *H03F 1/56* (2013.01); *H03F 3/19* (2013.01); *H03F 3/21* (2013.01); *H04B 1/40* (2013.01); *H03F 2200/222* (2013.01); *H03F 2200/387* (2013.01); *H03F 2200/451* (2013.01); *H03F 2200/465* (2013.01); *H03F 2200/555* (2013.01); *H03F 2201/3212* (2013.01)

(58) Field of Classification Search
CPC .................................. H03F 1/32; H04B 1/40
USPC ......................................................... 330/311
See application file for complete search history.

(56) References Cited

U.S. PATENT DOCUMENTS

| | | | | |
|---|---|---|---|---|
| 4,241,316 | A * | 12/1980 | Knapp | H03F 3/165 330/151 |
| 7,821,349 | B2 * | 10/2010 | Park | H03F 1/223 330/302 |
| 2002/0084855 | A1 * | 7/2002 | Kwon | H03F 1/223 330/311 |
| 2007/0296507 | A1 * | 12/2007 | Hamaguchi | H03F 1/0205 330/311 |
| 2009/0085670 | A1 * | 4/2009 | Jeong | H03F 1/223 330/302 |
| 2011/0063035 | A1 * | 3/2011 | Park | H03F 1/223 330/291 |
| 2014/0266461 | A1 * | 9/2014 | Youssef | H03F 3/68 330/295 |

* cited by examiner

*Primary Examiner* — Patricia T Nguyen
(74) *Attorney, Agent, or Firm* — Chang & Hale LLP (57) ABSTRACT

A radio-frequency (RF) module includes a driver transistor having a base, collector and emitter, an RF input port coupled to the base of the driver transistor, a cascode transistor having a base, collector and emitter, the emitter of the cascode transistor being coupled to the collector of the driver transistor, an RF output port coupled to the collector of the cascode transistor, and a coupling path connecting the base of the cascode transistor to the emitter of the cascode transistor, the coupling path including a capacitor.

16 Claims, 6 Drawing Sheets

DISTORTION CORRECTION IN CASCODE POWER AMPLIFIERS

CROSS-REFERENCE TO RELATED APPLICATION(S)

This application claims priority to U.S. Provisional Application No. 62/253,667, filed Nov. 10, 2015, and entitled DISTORTION CORRECTION IN CASCODE POWER AMPLIFIERS, the disclosure of which is hereby incorporated by reference in its entirety.

BACKGROUND

Field

The present disclosure relates to radio-frequency signal processing.

Description of the Related Art

Amplifier devices can be used in processing radio-frequency signals. Certain amplifier devices can suffer from undesirable distortion, which may affect system performance.

SUMMARY

In accordance with some implementations, the present disclosure relates to a radio-frequency module comprising a driver transistor having a base, collector and emitter, a radio-frequency input port coupled to the base of the driver transistor, a cascode transistor having a base, collector and emitter, the emitter of the cascode transistor being coupled to the collector of the driver transistor, a radio-frequency output port coupled to the collector of the cascode transistor, and a coupling path connecting the base of the cascode transistor to the emitter of the cascode transistor, the coupling path including a capacitor.

The capacitor of the radio-frequency module may have a value selected to at least partially reduce phase distortion generation by the cascode transistor. In certain embodiments, the radio-frequency module further comprises power detection circuitry connected between the base of the driver transistor and ground, the power detection circuitry being configured to sense a power level present on the base of the driver transistor and adjust a current flow through the driver transistor based on the sensed power level. The radio-frequency module may further comprise a resistor connected in series with the power detection circuitry between the power detection circuitry and the base of the driver transistor. The resistor may have a value selected to maintain gain linearity over an operational range of the radio-frequency module. In certain embodiments, the power detection circuitry includes a current source coupled to a base of a transistor device. The radio-frequency module may further comprise a DC bias circuit coupled to the base of the cascode transistor. The DC bias circuit may include a current source that is coupled to the base of the cascode transistor.

In some implementations, the present disclosure relates to a method of manufacturing a power amplifier module. The method may comprise forming a driver transistor having a base, collector and emitter, the base of the driver transistor being coupled to a radio-frequency input port, forming a cascode transistor having a base, collector and emitter, the emitter of the cascode transistor being coupled to the collector of the driver transistor, the collector of the cascode transistor being coupled to a radio-frequency output port, selecting a capacitor value for coupling between the base and emitter of the cascode transistor, and forming a coupling path connecting the base of the cascode transistor to the emitter of the cascode transistor, the coupling path including a capacitor having the selected capacitor value.

In certain embodiments, selecting the capacitor value involves performing a circuit simulation to determine an optimal capacitor value to reduce phase distortion generation in the cascode transistor. The method may further comprise coupling power detection circuitry to the base of the driver transistor via a grounding path including a resistor connected between the base of the driver transistor and the power detection circuitry. The method may further comprise selecting a resistor value to maintain gain linearity over an operational range of the driver transistor.

In some implementations, the present disclosure relates to a power amplifier circuit comprising a driver transistor having a base, collector and emitter, a radio-frequency input port coupled to the base of the driver transistor, a cascode transistor having a base, collector and emitter, the emitter of the cascode transistor being coupled to the collector of the driver transistor, a radio-frequency output port coupled to the collector of the cascode transistor, and a coupling path connecting the base of the cascode transistor to the emitter of the cascode transistor, the coupling path including a capacitor.

The capacitor may have a value selected to at least partially reduce phase distortion generation by the cascode transistor. The power amplifier circuit may further comprise power detection circuitry connected between the base of the driver transistor and ground, the power detection circuitry being configured to sense a power level present on the base of the driver transistor and adjust a current flow through the driver transistor based on the sensed power level. In certain embodiments, the power amplifier circuit further comprises a resistor connected in series with the power detection circuitry between the power detection circuitry and the base of the driver transistor. The resistor may have a value selected to maintain gain linearity over an operational range of the power amplifier circuit. In certain embodiments, the power detection circuitry includes a current source coupled to a base of a transistor device. The power amplifier circuit may further comprise a DC bias circuit coupled to the base of the cascode transistor. In certain embodiments, the DC bias circuit includes a current source that is coupled to the base of the cascode transistor.

DESCRIPTION

The headings provided herein are for convenience only and do not necessarily affect the scope or meaning of the claimed invention.

In certain implementations, the present disclosure relates to systems, devices and methods utilizing power amplifier (PA) modules. In radio-frequency (RF) communication circuits, relatively high power amplifiers may be used to increase the strength of a transmitted signal. Various power amplifier designs and topologies are disclosed herein, including cascode PAs, such as 5 GHz cascode PA designs.

RF power amplifiers often operate near saturation levels, and can suffer from various nonlinear effects that can degrade performance. The nonlinear effects of an amplifier at a specified frequency may be quantified by the AM-AM and AM-PM distortion; that is, the amplitude and phase modulations or distortions as functions of the amplitude of the input signal. In particular, AM-PM distortion based on phase shift that varies with input power level can be problematic in certain PA designs because such phase shift can cause degredation in error vector magnitude (EVM), possibly even when the amplifier has an acceptable 1 dB compression point and/or a relatively flat AM-AM curve.

Figure 1:
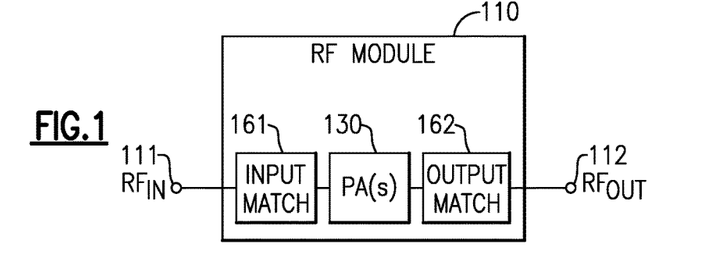
FIG. 1 shows a radio-frequency (RF) module including one or more power amplifiers according to one or more embodiments.

FIG. 1 shows that, in some embodiments, a radio-frequency (RF) module 110 can include one or more power amplifiers 130. The power amplifier(s) 130 may be connected between an RF input terminal 111 of the RF module 110 and an RF output terminal. In certain implementations, one or more of the power amplifier(s) 130 comprises a cascode power amplifier including at least two transistors, a driver transistor and a cascode transistor, wherein a collector of the driver transistor is coupled to an emitter of the cascode transistor. The power amplifier(s) 130 may be powered by a supply voltage (e.g., 5V supply) via a supply terminal (not shown).

The RF signal to be amplified may be received by the RF module 110 and provided to the power amplifier(s) 130 via an input impedance matching component 161, wherein the amplified version of the RF signal is provided to an output terminal 112 of the RF module 110 via an output impedance matching component 162. Thus, the input impedance matching component 161 is disposed between the RF input terminal 111 and the power amplifier input terminals and the output impedance matching component is disposed between the power amplifier output terminals and the RF output terminal 112. The input matching component 161 may be configured to match, for example, 50 ohms, to an impedance value that it may be desirable for the power amplifier module 130 to see. The output matching component 162 may be configured to adjust the low line of the power amplifier module 130.

Although certain embodiments are disclosed herein in the context of cascode power amplifiers, it should be understood that the various power amplifiers and power amplifier modules disclosed herein may include different types of power amplifiers, such as one or more single-transistor amplifiers, one or more multi-stage amplifiers (e.g., including a driver stage and an output stage), one or more Doherty amplifiers, or other types of power amplifiers.

Figure 2:
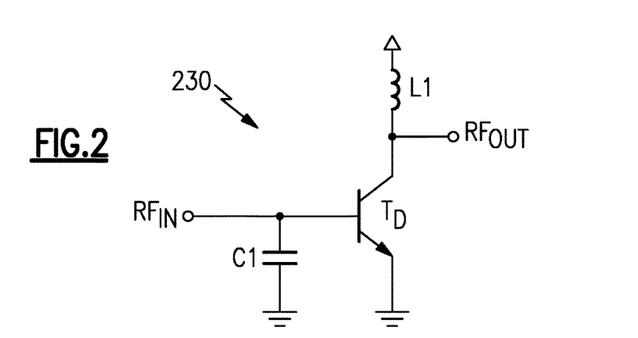
FIG. 2 is a circuit diagram illustrating a power amplifier circuit according to one or more embodiments.

FIG. 2 is a circuit diagram illustrating a power amplifier circuit 230 according to one or more embodiments. The circuit 230 may include a relatively large driver transistor $T_D$ coupled to an RF input port at its base and an RF output port at its collector (or emitter). Although certain configurations of emitters and collectors of bipolar junction transistors (BJTs) are described, it should be understood that such references to emitters may be understood to refer to collectors, and vice versa. Furthermore, although the present disclosure focuses on BJT-based power amplifiers, the principles disclosed herein may be applicable in power amplifier systems utilizing other types of transistors, such as metal-oxide-semiconductor field-effect transistors (MOSFETs), wherein drains/sources of such devices may be used analogously in place of the disclosed emitters/collectors.

The transistor $T_D$ may be considered a common-emitter amplifier. It may be desirable for a power amplifier circuit like that shown in FIG. 2 to be designed to meet certain performance parameters. For example, in one implementation, the power amplifier circuit 230 may be designed to have a 1 dB compression point of approximately 26 dBm. The collector of the driver transistor $T_D$ may be coupled to a power supply, such as a 5V supply.

The circuit 230 may include a capacitor C1 (e.g., a metal-insulator-metal (MIM) capacitor) connected between the base of the driver transistor TD and ground, which may be provided to at least partially reduce AM-PM distortion in the amplifier $T_D$ (e.g., flatten/linearize the AM-PM curve of the amplifier). The capacitor C1 may be considered to be effectively in parallel with the nonlinear capacitance of the transistor $T_D$, making the overall capacitance of the circuit 230 less sensitive to input level. However, insertion of a base capacitor may not be as effective in reducing AM-PM distortion in certain cascode amplifier topologies, which may generally suffer from AM-PM distortion to a greater degree than simple common-emitter designs.

Figure 3:
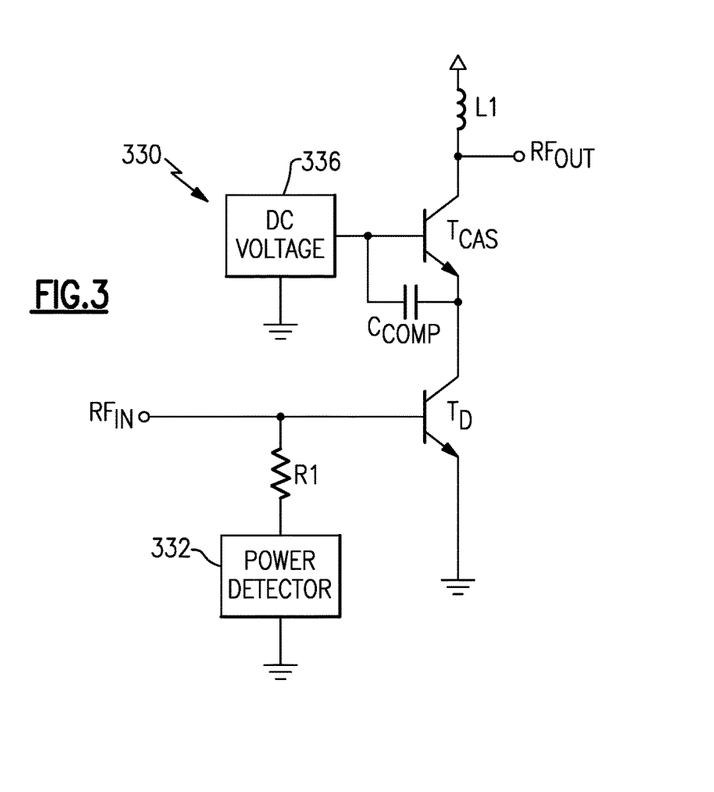
FIG. 3 is a circuit diagram illustrating a cascode power amplifier circuit according to one or more embodiments.

FIG. 3 is a circuit diagram illustrating a cascode power amplifier circuit 330 according to one or more embodiments. As referenced above, a base capacitor on the driver transistor of a cascode power amplifier design may not provide adequate AM-PM distortion correction. This may be primarily because the driver transistor $T_D$ in a cascode design may not see voltage swings as volatile as a driver transistor in a common-emitter amplifier like that shown in FIG. 2. Instead, the cascode transistor $T_{CAS}$ may be subject to AM-PM effects from voltage swing volatility. Therefore, linearization of the driver transistor $T_D$ may not substantially improve the AM-PM curve.

In certain embodiments, as shown in FIG. 3, a linearizing capacitor $C_{COMP}$ may be placed in parallel with the base-emitter capacitance of the cascode device $T_{CAS}$. Placing the capacitor $C_{COMP}$ in this location may allow for modification of the shape of the AM-PM curve by changing the size of the device $T_{CAS}$. That is, the transistor $T_{CAS}$ may be sized to optimize/alter the flatness of the AM-PM curve, as needed.

In addition, the circuit 330 may include a bias cell coupled to the base of the driver transistor $T_D$, such as a power detector module/circuit 332. A resistor R1 placed in series with the power detector 332 may further allow for adjustment of the AM-AM and/or AM-PM curves substantially independently of each other.

The power detector 332 may provide an adaptive biasing network at the base of the driver transistor $T_D$. With the base of the transistor $T_D$ AC-grounded and biased, gain curve linearization may be improved in certain embodiments. The power detector 332 may be configured to sense the input power level provided at the base of the driver transistor $T_D$ by the RF input signal, and further to adjust the current flow through the driver transistor $T_D$ and the cascode transistor $T_{CAS}$ accordingly based on the amount of power detected to be driven into the driver $T_D$. Therefore, the current flow through the amplifier may be substantially proportional to the to the power level present at the base of the driver transistor, such that increased current may be available to handle increased power requirements. The resistor R1 may at least partially control the amount of gain expansion in the circuit 330. Therefore, it may be desirable for the value of R1 to be chosen such that the gain of the amplifier remains substantially flat over an operational range of the amplifier. With a relatively large resistor value, a relatively constant current may flow into the amplifier; as the signal power increases, the transistor $T_D$ may at least partially compress, causing the gain to drop. With a relatively small resistor value, as the power level increases, causing the transistor $T_D$ to compress and become nonlinear, a higher current level may be injected into the base of the transistor $T_D$ to effectively offset the nonlinearity caused by increased power.

It may be desirable for the base of the cascode transistor $T_{CAS}$ to be substantially free of RF signal, such that a substantially fixed DC voltage is present at the base of the device. In certain embodiments, the circuit 330 includes a DC voltage source, or the like, connected between the base of the cascode transistor $T_{CAS}$ and ground, which may provide DC voltage to the base of the cascode transistor $T_{CAS}$. In certain embodiments, a capacitor $C_{COMP}$, or some type of capacitance, may be connected between the base and emitter (or collector) of the cascode transistor $T_{CAS}$. The capacitor (or other capacitance) $C_{COMP}$ may serve to provide a ground reference with respect to RF transmission.

Figure 4:
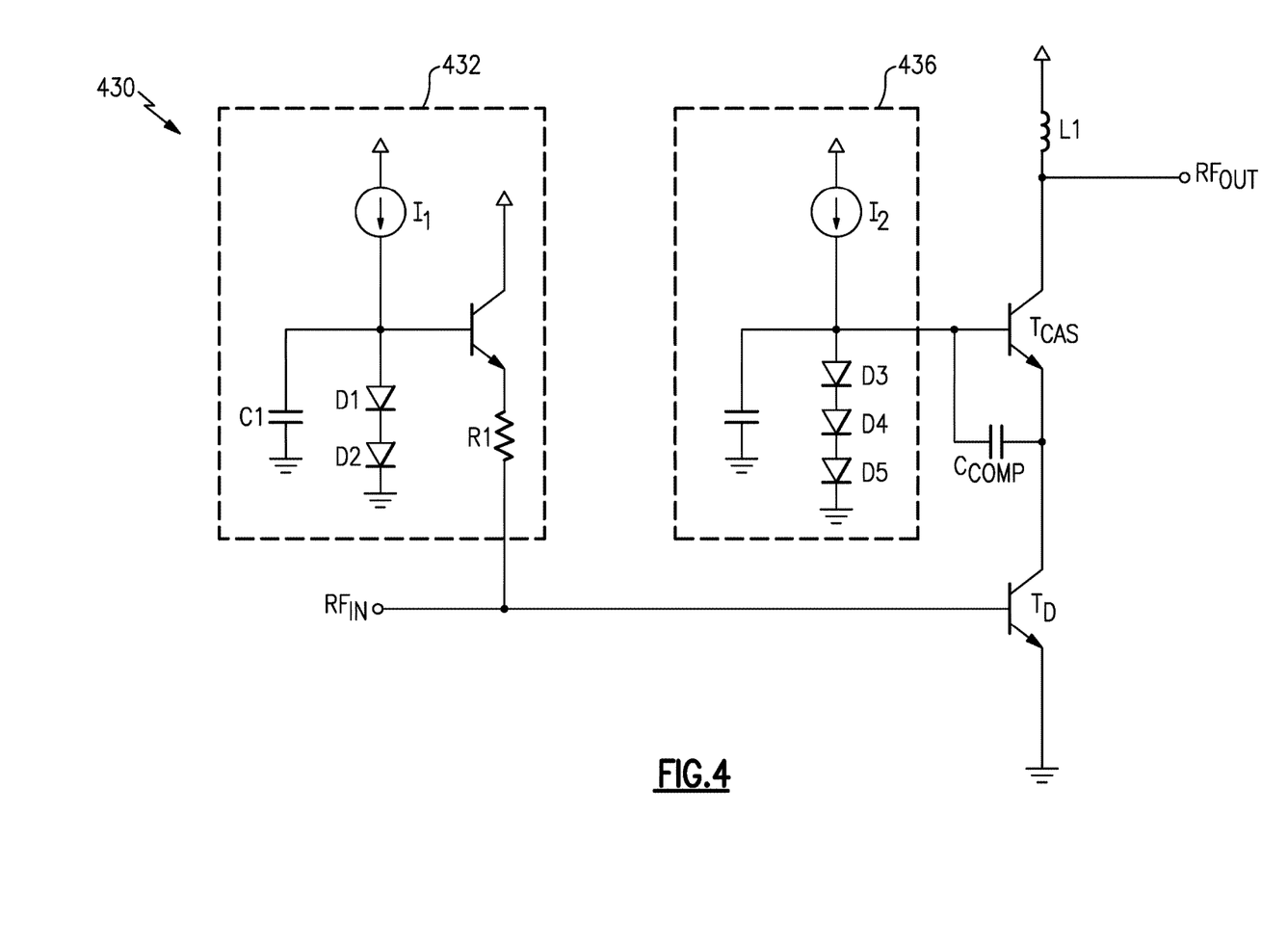
FIG. 4 is a circuit diagram illustrating a cascode power amplifier circuit according to one or more embodiments.

FIG. 4 is a circuit diagram illustrating a cascode power amplifier circuit 430 according to one or more embodiments. As described above, for cascode power amplifiers, the cascode transistor $T_{CAS}$, not the driver transistor $T_D$, may be primarily responsible for AM-PM phase shift over input power level. Therefore, AM-PM correction may advantageously be applied to the cascode transistor $T_{CAS}$.

The circuit 430 includes power detector circuitry 432, which receives input power from the RF input signal and outputs a current level into the base of the driver transistor $T_D$. In order to prevent the power detector circuitry 432 from increasing the current to the amplifier by too great an amount, the circuitry 432 includes a resistor R1 configured to control the amount of input power that is seen by the power detector 432.

DC bias circuitry 436 may be coupled to the base of the cascode transistor $T_{CAS}$. As a nonlinear device, the base-to-emitter voltage of the transistor $T_{CAS}$ may be sensitive to the signal power level present at the base due to, for example, second-order distortion. The cascode transistor $T_{CAS}$ may cause AM-PM distortion to a greater extent than the driver transistor $T_D$ in certain embodiments in view of such voltage swings; the driver transistor $T_D$ may see a relatively smaller voltage swing, and may therefore be more linear. Therefore, unlike the embodiment illustrated in FIG. 2 in which an AM-PM distortion correcting capacitor is placed between the base of the transistor $T_D$ and ground, the circuit 430 includes an AM-PM distortion compensating capacitor $C_{COMP}$ between the emitter of the cascode transistor $T_{CAS}$ and its base.

The DC bias circuitry 436 may include a current source 12 and one or more diodes (e.g., diodes D3, D4, D5) connected in parallel at the base of the cascode transistor $T_{CAS}$. The circuitry 436 may provide a DC voltage to the base of the cascode transistor $T_{CAS}$. The capacitor within the DC bias circuitry 436 may serve to provide a ground reference at the base of the transistor $T_{CAS}$ with respect to RF signals, resulting in a substantially fixed DC value at the base of the transistor $T_{CAS}$. In certain embodiments, the DC bias circuitry 436 includes a DC battery source as an alternative to, or in addition to, the current source 12 and diode(s) (D3, D4, D5).

According to certain embodiments, the values of $C_{COMP}$ and R1 may be selected to provide optimal AM-PM performance. Selection of values for R1 and $C_{COMP}$ may be based on simulation. For example, because the transistors of the circuit may handle relatively large signals, they may generally operate in a relatively nonlinear manner, and therefore simulation may be a desirable means for identifying the desired resistor and/or capacitor values.

Figure 5A:
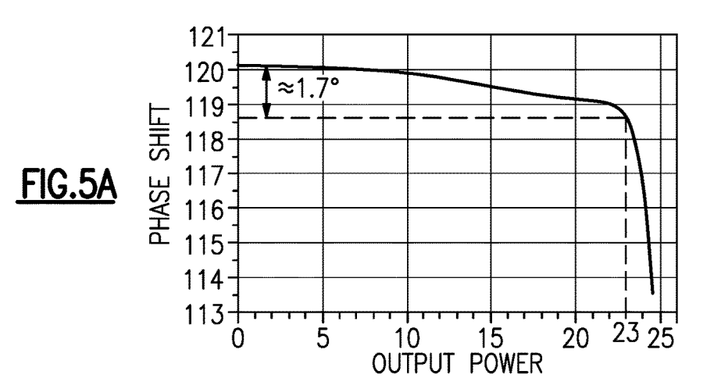
FIGS. 5A-5C provides example simulation results for cascode power amplifier performance circuits utilizing different amounts of base-to-emitter AM-PM compensation capacitance on cascode transistors according to certain embodiments.
Figure 5B:
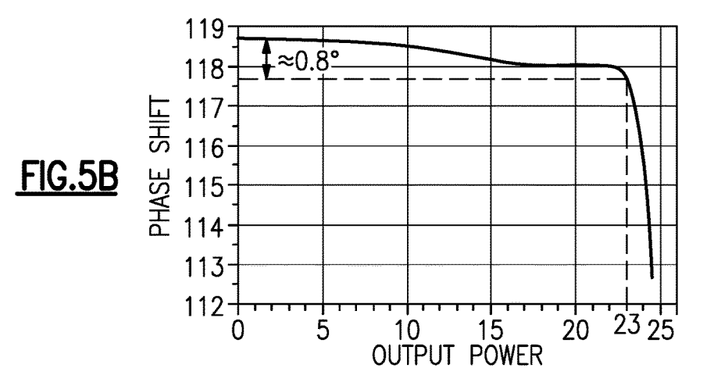
Figure 5C:
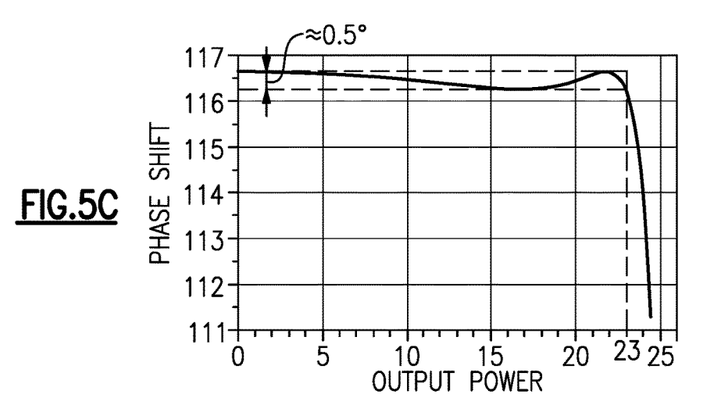

FIGS. 5A-5C provides example simulation results for cascode power amplifier performance circuits utilizing different amounts of base-to-emitter AM-PM compensation capacitance on the cascode transistor, wherein each of the figures represents possible performance for a different simulated capacitance value.

FIG. 5A represents power amplifier performance for an example circuit in which no added base-to-emitter capacitance is present on the cascode transistor. In the example of FIG. 5A, phase shift starts out at about 120 degrees, and as the input power increases, the phase shift goes down gradually.

As described above, it may be desirable for phase shift through the amplifier to remain constant with power level. Placing a compensating capacitor into the circuit, as disclosed herein, may serve to introduce a phase shift into the amplifier, which may compensate for the natural phase shift that the amplifier may otherwise produce. FIG. 5B represents power amplifier performance for an example circuit in which a 2 pF capacitor is present between the base and emitter of the cascode transistor. In the example of FIG. 5B, the phase shift starts at about 120 degrees at relatively low power levels, and drops to about 113 degrees as the power level increases. As illustrated, with the added capacitance, the phase shift may remain more constant up to a higher power level.

FIG. 5C represents power amplifier performance for an example circuit in which a 5 pF capacitor is present between the base and emitter of the cascode transistor. In the example of FIG. 5C, the phase shift the phase curve may be even more flattened out, and the total phase shift may be less. This may represent an improvement in error vector magnitude (EVM) performance for the amplifier. The total drop-off of the graph of FIG. 5C may be less than for FIGS. 5A and 5B.

Figure 6A:
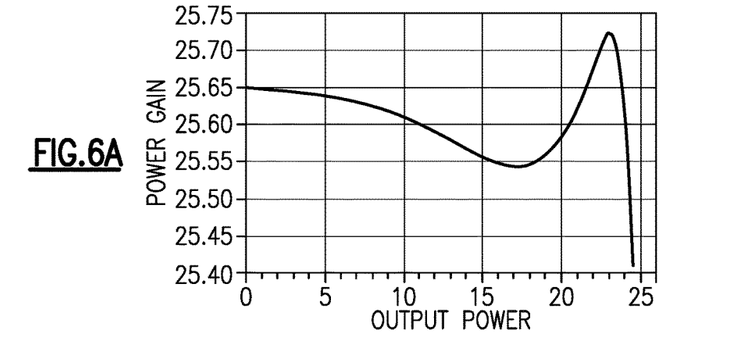
FIGS. 6A-6C provide example simulation results for cascode power amplifier performance circuits utilizing different resistor values for coupling power detection circuitry to the base of a driver transistor according to certain embodiments.
Figure 6B:
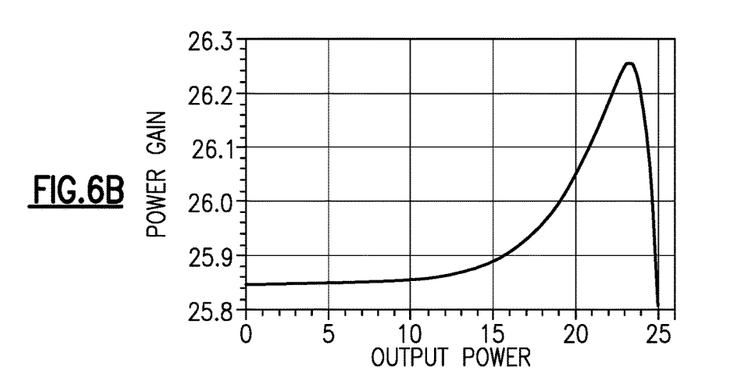
Figure 6C:
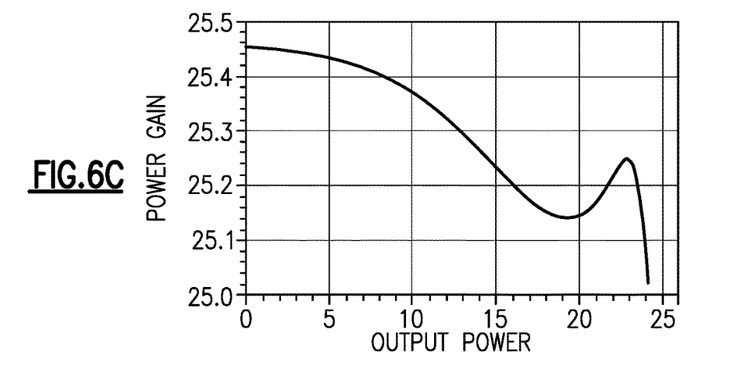

FIGS. 6A-6C provide example simulation results for cascode power amplifier performance circuits utilizing different resistor values for coupling power detection circuitry to the base of the driver transistor, as included in certain of the figures and text provided herein. The illustrated plots show the potential effect of adjusting the value of R1 in, for example, the circuit 430 of FIG. 4. The power detector circuitry associated with the subject resistor may serve to sense RF power and adjusts the bias of the power amplifier circuit accordingly. With a resistor present coupling the power detection circuitry to the base of the driver transistor, it may be possible to change the shape of the AM-AM curve. The curves of FIGS. 6A-6C may correspond to circuits comprising a base-to-emitter capacitor on the cascode transistor having a value of 5 pF.

Where the resistor value is larger than optimal, as power level goes up, gain may decrease; where the resistor value is smaller than optimal, as power increases, current flow through the driver transistor may increase more quickly than is desirable, causing gain to increase. FIG. 6A provides power gain for a circuit implementing a resistor having a value of 12 ohms. With a resistor value of 12 ohms, a relatively flat gain curve may advantageously result.

FIG. 6B represents a potential gain curve for a circuit utilizing a resistor having a value that is too low, such as 8 ohms, for example, which may produce relatively high gain peaking at high power. As shown in FIG. 6B, too little resistance may produce significant gain expansion resulting from undesirably high sensitivity of the power detection circuitry.

FIG. 6C represents a potential gain curve for a circuit utilizing too high a value for the resistor, such as 16 ohms, for example, which may result in the gain falling off at a lower power level without returning. In certain embodiments with undesirably high resistor values, the bias boost may effectively vanish altogether, and the 1 dB compression point may drop to a lower power level. In addition, the slope of the curve may lead to higher EVM even at lower power levels.

Figure 7:
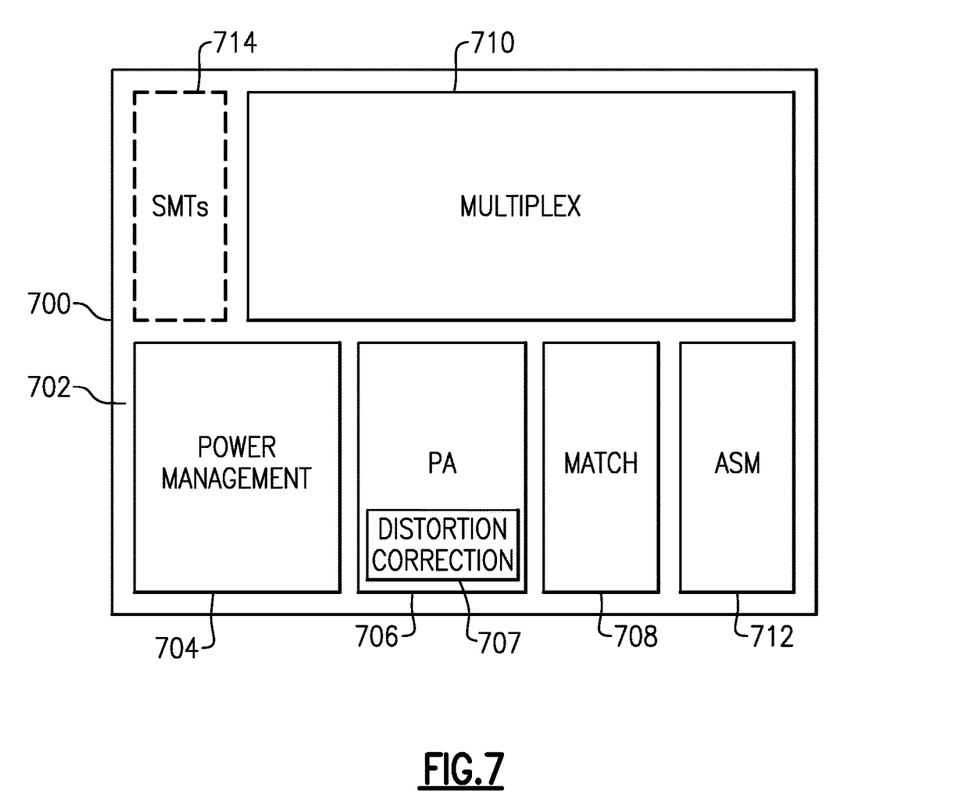
FIG. 7 shows a front-end module (FEM) according to one or more embodiments.

FIG. 7 shows that in some embodiments, some or all of power amplification configurations (e.g., those shown in FIGS. 3-4) can be implemented, wholly or partially, in a module. Such a module can be, for example, a front-end module (FEM). In the example of FIG. 7, a module 700 can include a packaging substrate 702, and a number of components can be mounted on such a packaging substrate. For example, a power management module 704, a power amplifier module 706 (which can include distortion correction circuitry/component(s) designed to provide AM-PM distortion correction as disclosed herein), an impedance matching module 708, and a multiplexer assembly 710 can be mounted and/or implemented on and/or within the packaging substrate 702. Other components such as a number of SMT devices 714 and an antenna switch module (ASM) 712 can also be mounted on the packaging substrate 702. Although all of the various components are depicted as being laid out on the packaging substrate 702, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
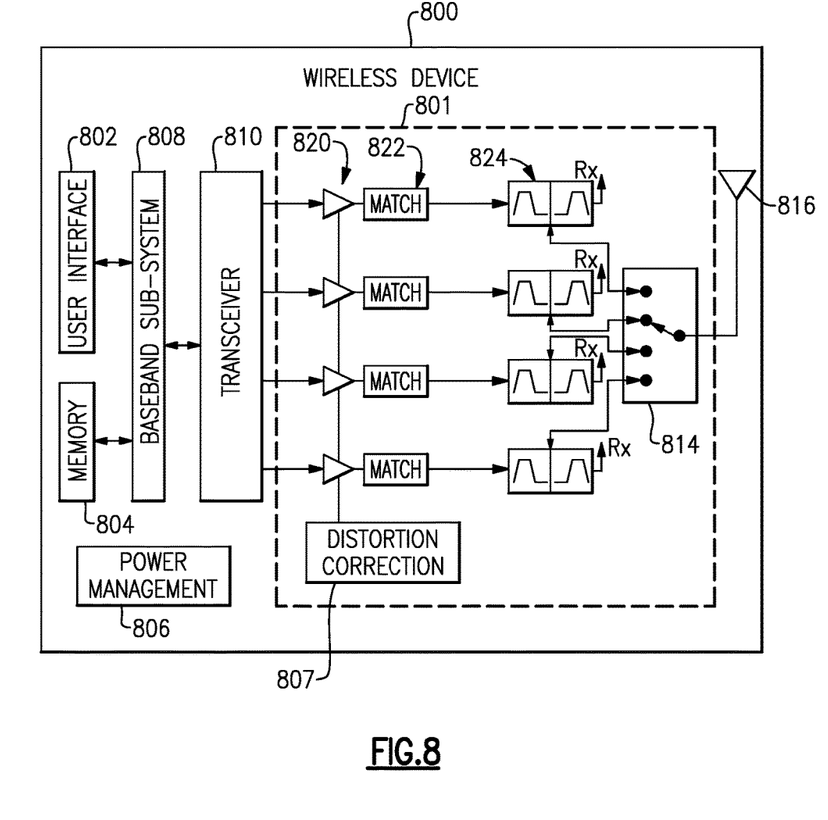
FIG. 8 shows a wireless device implementing distortion correction according to one or more embodiments.

FIG. 8 schematically depicts an example wireless device 800 having one or more advantageous features described herein. The wireless device 800 may comprise one or more power amplifiers (PAs) 820 can receive their respective RF signals from a transceiver 810 that can be configured and operated in known manners to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 can also be in communication with a power management component 806 that is configured to manage power for the operation of the wireless device 800. Such power management can also control operations of the baseband sub-system 808 and the module 801. The power amplifiers 820 may have AM-PM distortion compensation circuitry 807 associated therewith according to one or more embodiments disclosed herein.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In the example wireless device 800, outputs of the PAs 820 are shown to be matched (via respective match circuits 822) and routed to their respective diplexers 824. Such amplified and filtered signals can be routed to an antenna 816 (or multiple antennas) through an antenna switch 814 for transmission. In some embodiments, the diplexers 824 can allow transmit and receive operations to be performed simultaneously using a common antenna (e.g., antenna 816). In FIG. 8, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency module comprising:
    a driver transistor having a base, collector and emitter;
    a radio-frequency input port coupled to the base of the driver transistor;
    a cascode transistor having a base, collector and emitter, the emitter of the cascode transistor being coupled to the collector of the driver transistor;
    a radio-frequency output port coupled to the collector of the cascode transistor; and
    a capacitor connected at a first end to the emitter of the cascode transistor and at a second end to a node coupled in parallel to a current source and one or more diodes.

2. The radio-frequency module of claim 1 wherein the capacitor has a value selected to at least partially reduce phase distortion generation by the cascode transistor.

3. The radio-frequency module of claim 1 further comprising power detection circuitry connected between the base of the driver transistor and ground, the power detection circuitry being configured to sense a power level present on the base of the driver transistor and adjust a current flow through the driver transistor based on the sensed power level.

4. The radio-frequency module of claim 3 further comprising a resistor connected in series with the power detection circuitry between the power detection circuitry and the base of the driver transistor.

5. The radio-frequency module of claim 4 wherein the resistor has a value selected to maintain gain linearity over an operational range of the radio-frequency module.

6. The radio-frequency module of claim 3 wherein the power detection circuitry includes a current source coupled to a base of a transistor device.

7. A method of manufacturing a power amplifier module, the method comprising:
    forming a driver transistor having a base, collector and emitter, the base of the driver transistor being coupled to a radio-frequency input port;
    forming a cascode transistor having a base, collector and emitter, the emitter of the cascode transistor being coupled to the collector of the driver transistor, the collector of the cascode transistor being coupled to a radio-frequency output port;
    selecting a capacitor value for coupling between the base and emitter of the cascode transistor; and
    connecting a capacitor at a first end to the emitter of the cascode transistor and at a second end to a node coupled in parallel to a current source and one or more diodes.

8. The method of claim 7 wherein said selecting the capacitor value involves performing a circuit simulation to determine an optimal capacitor value to reduce phase distortion generation in the cascode transistor.

9. The method of claim 7 further comprising coupling power detection circuitry to the base of the driver transistor via a grounding path including a resistor connected between the base of the driver transistor and the power detection circuitry.

10. The method of claim 9 further comprising selecting a resistor value to maintain gain linearity over an operational range of the driver transistor.

11. A power amplifier circuit comprising:
    a driver transistor having a base, collector and emitter;
    a radio-frequency input port coupled to the base of the driver transistor;
    a cascode transistor having a base, collector and emitter, the emitter of the cascode transistor being coupled to the collector of the driver transistor;
    a radio-frequency output port coupled to the collector of the cascode transistor; and
    a capacitor connected at a first end to the emitter of the cascode transistor and at a second end to a node coupled in parallel to a current source and one or more diodes.

12. The power amplifier circuit of claim 11 wherein the capacitor has a value selected to at least partially reduce phase distortion generation by the cascode transistor.

13. The power amplifier circuit of claim 11 further comprising power detection circuitry connected between the base of the driver transistor and ground, the power detection circuitry being configured to sense a power level present on the base of the driver transistor and adjust a current flow through the driver transistor based on the sensed power level.

14. The power amplifier circuit of claim 13 further comprising a resistor connected in series with the power detection circuitry between the power detection circuitry and the base of the driver transistor.

15. The power amplifier circuit of claim 14 wherein the resistor has a value selected to maintain gain linearity over an operational range of the power amplifier circuit.

16. The power amplifier circuit of claim 13 wherein the power detection circuitry includes a current source coupled to a base of a transistor device.

* * * * *